United States Patent
Matsumoto et al.

(10) Patent No.: US 6,369,674 B1
(45) Date of Patent: Apr. 9, 2002

(54) BROAD-BAND SURFACE ACOUSTIC WAVE FILTER WITH SPECIFIC RATIOS OF TRANSDUCER ELECTRODE PERIOD TO REFLECTOR PERIOD

(75) Inventors: Shozo Matsumoto; Yoshihisa Watanabe; Yuji Ogawa, all of Kouza-gun (JP)

(73) Assignee: Toyo Communication Equipment Co., Ltd., Kanagawa (JP)

( * ) Notice: Subject to any disclaimer, the term of this patent is extended or adjusted under 35 U.S.C. 154(b) by 0 days.

(21) Appl. No.: 09/403,362

(22) PCT Filed: Jan. 18, 1999

(86) PCT No.: PCT/JP99/00127

§ 371 Date: Oct. 19, 1999

§ 102(e) Date: Oct. 19, 1999

(87) PCT Pub. No.: WO99/44285

PCT Pub. Date: Sep. 2, 1999

(30) Foreign Application Priority Data

Feb. 27, 1998 (JP) .............................. 10-064140

(51) Int. Cl.$^7$ .............................. H03H 9/64; H03H 9/25
(52) U.S. Cl. .................. 333/195; 310/313 D
(58) Field of Search ................. 333/193–196; 310/313 R, 313 B, 313 C, 313 D

(56) References Cited

U.S. PATENT DOCUMENTS

| | | | |
|---|---|---|---|
| 5,631,515 A | * | 5/1997 | Mineyoshi et al. ...... 310/313 B |
| 6,037,700 A | * | 3/2000 | Tanaka et al. .......... 333/195 X |

FOREIGN PATENT DOCUMENTS

| | | | |
|---|---|---|---|
| JP | S58-85617 A | 5/1983 | |
| JP | S62-130010 | 6/1987 | |
| JP | H2-250412 | 10/1990 | |
| JP | 3-182111 | * 8/1991 | .................. 333/193 |
| JP | H4-40705 | 2/1992 | |
| JP | H4-207615 | 7/1992 | |
| JP | H7-66668 A | 3/1995 | |
| JP | 7-307640 | * 11/1995 | |
| JP | H8-321743 | 12/1996 | |
| JP | 9-186553 | * 7/1997 | |
| JP | 10-270983 | * 10/1998 | |

OTHER PUBLICATIONS

Yasushi Kuroda et al., "Wide Bandwith SAW Resonator Filter Using 36°Y–X LiTaO$_3$ Substrate", *IEICE Trans. Fundamentals*, vol. E78–A, No. 5, May, 1995.

Yasushi Kuroda et al., "Broadband SAW Resonator Filter Using 36°Y–X LiTaO$_3$", Autumn Conference of Institute of Electronics, Information and Communication Engineers (IEICE), Sep., 1994.

Toshihiro Kojima, "Surface Acoustic Wave Engineering, Introduction (1)—Simple Equivalent Circuit of IDT", *New Ceramics*, vol. 6, No. 7, Jul. 1993.

Author: Kimio (Kan'o) Shibayama, Title: Danseiha Soshi Handbook, (Elastic–Wave Element Technology Handbook) Publisher: Ohmusha, Ltd., Date: Nov. 30, 1991, Pertinent Pages: 218, Right Column, Lines 10–20, Fig. 3.130; 175–177, Figs. 3.45, 3.46, 3.47.

* cited by examiner

*Primary Examiner*—Robert Pascal
*Assistant Examiner*—Barbara Summons
(74) *Attorney, Agent, or Firm*—Koda & Androlia

(57) ABSTRACT

In a longitudinally coupled multi-mode surface acoustic wave filter, for the purpose of setting a stop band width of reflectors to a proper width according to a required filter, since a line occupation rate of the reflectors has been made smaller than a line occupation rate of an IDT electrode, and respective periods of the reflector and the IDT electrode are set properly such that the stop band width of the reflector and the band width of the longitudinally coupled multi-mode surface acoustic wave filter have been approximately equal to each other, means for broadening the band of the longitudinally coupled multi-mode SAW filter can be obtained for a broad-band RF filter of a portable telephone used in a new system.

4 Claims, 4 Drawing Sheets

BROAD-BAND SURFACE ACOUSTIC WAVE FILTER WITH SPECIFIC RATIOS OF TRANSDUCER ELECTRODE PERIOD TO REFLECTOR PERIOD

TECHINCAL FIELD

The present invention relates to a broad-band surface acoustic wave filter, and more particularly to a broad-band surface acoustic wave filter which expands a pass band width of a longitudinally coupled surface acoustic wave filter as compared with that of a conventional surface acoustic wave filter for adaptation to a new system of a mobile communication.

BACKGROUND ART

In recent years, a surface acoustic wave filter (hereinafter to be referred to as a SAW filter) has been used in many communication fields, and has been playing the role in reducing the sizes of portable telephones and the like because of its excellent characteristics in high frequency, compactness, easiness in mass production, and the like.

FIG. 4 is an illustrative plan view showing a structure an electrode pattern of a conventional primary-third order (1–3 order) longitudinally coupled double mode SAW filter (hereinafter to be referred to as a double mode SAW filter). On a main surface of a piezoelectric substrate 11, there are provided three IDT electrodes 12, 13 and 14 closely disposed to each other along a propagation direction of a surface acoustic wave, with reflectors 15a and 15b disposed on each sides of IDT electrodes 13 and 14.

Each of the IDT electrodes 12, 13 and 14 is structured by a pair of comb electrodes having a plurality of electrode fingers, with each electrode finger of one comb electrode inserted between a space between adjacent fingers of the other comb electrode. One of the comb electrodes of the IDT electrode 12 is connected to an input terminal while the other comb electrode is grounded. Ones of the comb electrodes of the IDT electrodes 13 and 14 are mutually connected to each other and they are connected to an output terminal and the other comb electrodes thereof are respectively grounded.

As well known, the double mode SAW filter shown in FIG. 4 operates as follows. A plurality of surface waves excited by the IDT electrodes 12, 13 and 14 are trapped between the reflectors 15a and 15b, and an acoustic coupling is generated among the IDT electrodes 12, 13 and 14. As a result, two longitudinal coupled resonance modes of the primary and third-order are excited strongly, and the filter operates as a double mode SAW filter utilizing these two modes by a proper termination. It is well known that a pass band width of the double mode SAW filter is determined depending upon a frequency difference between the primary order resonance mode and the third-order resonance mode.

Also, it is well known that a plurality of the double mode SAW filters are disposed on a piezoelectric substrate and they are connected in cascade, thereby improving an shape factor and a guaranteed attenuation amount of a filter.

However, there is a problem that, when a broad-band primary-third order (1–3 order) longitudinally coupled double mode SAW filter having a central frequency of 900 MHz band is manufactured using 36° Y-cut X-propagation $LiTaO_3$ ($LiTaO_3$), for example, as a piezoelectric substrate on the basis of the conventional design, the limit of a pass band width of 1.0 dB is 30 MHz at the most. Therefore, it is difficult to realize a filter having a broad band width of 40 MHz or more and a flat pass band characteristics required for a new portable telephone.

It is supposed as means for solving the above problem that, when a difference between resonance frequency of a primary order mode and resonance frequency of a third order mode is widen, it is possible to broaden the pass band width of the double mode SAW filter.

Therefore, as is well known, a double mode SAW filter has been manufactured in a trial manner so as to reduce the number of IDT electrode pairs and select a space between input and output IDT electrodes appropriately, thereby broadening a resonance interval between the primary mode and the third-order mode. In the trial manufacturing, when 36° Y-X $LiTaO_3$ is used as a piezoelectric substrate, the numbers of IDT electrode pair 12 is set to 22.5, the numbers of IDT electrode pairs 13 and 14 are respectively set to 15.5, the numbers of reflectors 15a and 15b are respectively 100, the film thickness $H/\lambda$ ($\lambda$ is a wave length of a surface acoustic wave) of an aluminum electrode is 6%, an aperture length is 60$\lambda$, periods of the IDT electrodes 12, 13, 14, and the reflectors 15a, 15b are respectively $L_T$, and $L_R$, a filtering characteristic obtained when $L_T/L_R$ is set to 0.978 is shown in FIG. 6.

As apparent from FIG. 6, there occurs a problem that, though the band width expands, a flatness lacks on the high band side of the pass band so that a sufficient pass band characteristic can not be obtained.

Meanwhile, since the number of electrode finger pairs is reduced as compared with a conventional art, there has occurred a problem that the terminal impedance of the filter is increased from a general terminal impedance of 50Ω.

It is well known as shown in FIG. 5 that the terminal impedance of a double mode SAW filter greatly depends on a ratio W/(W+S) of an electrode finger width W to the sum (W+S) of an electrode finger width W and a space width S, namely, a so-called line occupation rate. Accordingly, the line occupation rate $R_T=W_T/(W_T+S_T)$ of the IDT electrodes 12, 13, 14 is made large as 0.5 to 0.8 so that the terminal impedance can be set to 50Ω. However, the conditions that the pass band required for an RF filter of a portable telephone of a new system is broad and it is flat have not been satisfied yet.

The present invention has been attained for solving the above problems, and an object thereof is to provide a double mode SAW filter which has a broad band and where a pass band characteristic is flat.

DISCLOSURE OF THE INVENTION

In order to achieve the above object, a broad-band surface acoustic wave filter of claim 1 according to the present invention is characterized in that, in a longitudinally coupled multi-mode surface acoustic wave filter configured by disposing a plurality of IDT electrodes on an piezoelectric substrate in a propagating direction of surface acoustic wave and disposing reflectors on both sides of the IDT electrodes, the electrode width $W_R$ of each reflector is made smaller than a gap between electrode fingers of each reflectors.

The invention of claim 2 is characterized in that, in a longitudinally coupled multi-mode surface acoustic wave filter configured by disposing a plurality of IDT electrodes on an piezoelectric substrate in a propagating direction of surface acoustic wave and disposing reflectors on both sides of the IDT electrodes, the line occupation rate of the reflectors is made smaller than the occupation rate of the IDT electrodes.

The invention of claim 3 is characterized in that, in claim 1 or 2, when a period between the electrode fingers of the IDT electrode is $L_T$ and a period of the reflector is $L_R$, a ratio of the periods $L_T$ and $L_R$ is set such that a central frequency of a stop band of the reflector and a central frequency of the longitudinally coupled multi-mode surface acoustic wave filter are almost equal to each other.

BEST MODE FOR CARRYING OUT THE INVENTION

Figure 1:
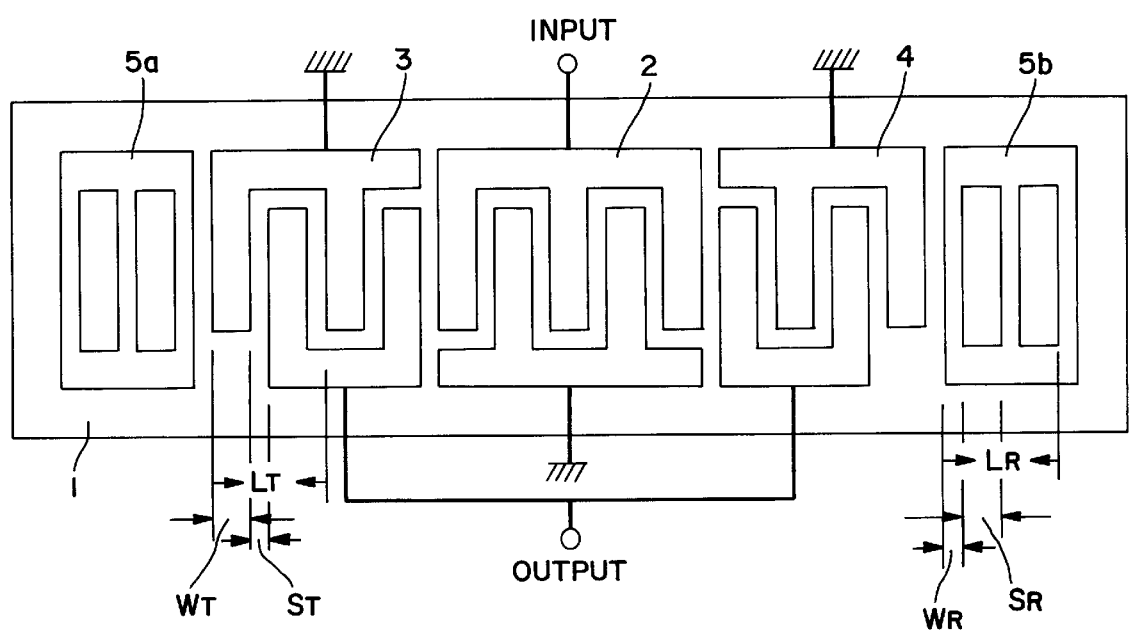
FIG.1 is an illustrative plan view showing an electrode configuration of a primary-third order (1–3 order) longitudinally coupled double mode SAW filter according to the present invention.

The present invention will be explained in detail with reference to an embodiment shown in the drawings.

Herein, in order to facilitate understanding of the present invention prior to explanation of the embodiment, explanation will be given of the process where the present invention has been attained.

Various experiments have been performed in order to solve a point where a sufficient pass band characteristic can not be obtained at a high band side of the pass band, even though a resonance interval between the primary and the third-order modes of a double mode SAW filter has been broadened by reducing the number of electrode finger pairs of an IDT electrode.

As a result, it is considered that, even if the numbers of electrode pairs of IDT electrodes 2, 3, 4 are reduced and a resonance interval between the primary and the third-order modes is broadened, since the stop band width of reflectors 5a, 5b is kept narrow as is original, a resonance frequency of one of the primary mode and the third-order mode exists outside the stop band, thereby deteriorating flatness at the high band side of the pass band.

On the basis of the above knowledge, as shown in FIG. 1, various trial double mode SAW filters have been manufactured by changing a period $L_T$ of the IDT electrodes 2, 3, 4, its occupation rate $R_T$, a period $L_R$ of the reflectors 5a, 5b its occupation rate $R_R$, an electrode film thickness H/λ and the like. Ratios $L_T/L_R$ of the period $L_T$ of the IDT electrodes 2, 3, 4 to the period $L_R$ of the reflectors 5a, 5b have been selected to be 0.994 and 0.986, and the line occupation rate $R_T$ of the IDT electrodes 2, 3, 4 and the occupation rate $R_R$ of the reflectors 5a, 5b have been respectively changed from 0.35 to 0.6 in a matrix manner, so that characteristics of a double mode SAW filter such as a band width, flatness of a pass band, cutoff characteristic of the pass band, insertion loss and the like have been measured.

As a result, it has been found that, contrary to a conventional art where the occupation rate of the IDT electrodes 2, 3, 4 and the line occupation rate of the reflectors 5a, 5b are set approximately equal to each other, the occupation rate $R_R$ of the reflectors 5a, 5b is made smaller than the line occupation rate $R_T$ of the IDT electrodes 2, 3, 4 so that the stop band width of the reflector is expanded and the pass band of the filter is broadened.

On the basis of the above fact, experiment has been further made, where a relationship between the stop band width $\Delta f/f_0$ of the reflectors 5a, 5b and the line occupation rate $R_R$ has been examined experimentally in a state in which the electrode film thickness H/λ has been set constant.

Figure 2:
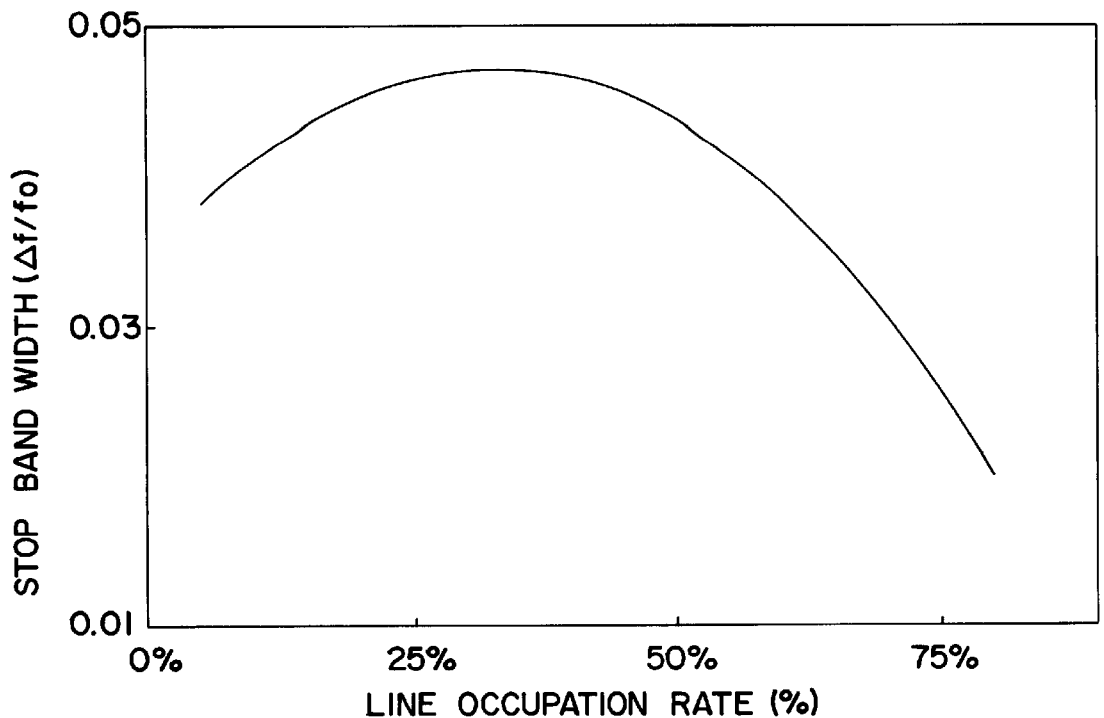
FIG. 2 is a graph showing a relationship between a line occupation rate W/(W+S) and a stop band width $\Delta f/f_0$.

39° Y-X LiTaO$_3$ has been used as a piezoelectric substrate 1, and, in conditions that the number of the IDT electrode pairs 2 is 15.5, the numbers of the IDT electrodes pairs 3, 4 are respectively 9.5, the numbers of the reflectors 5a, 5b are respectively 150, the aperture length is 60 λ, the electrode film thickness H/λ is in a range of 6 to 9%, and the line occupation rate $R_T$ of the IDT electrodes 2, 3, 4 is 70%, the line occupation rate $R_R$ of the reflectors 5a, 5b has been changed from 30% to 50%. FIG. 2 shows a portion of the result of the experiment. It will be understood that this example shows a curved characteristic having a peak when the line occupation rate $R_R$ is 30% in a case where the electrode film thickness H/λ is 6% λ. It has been confirmed that a peak is obtained at a position where the line occupation rate is less than 50% even in other conditions.

Figure 3:
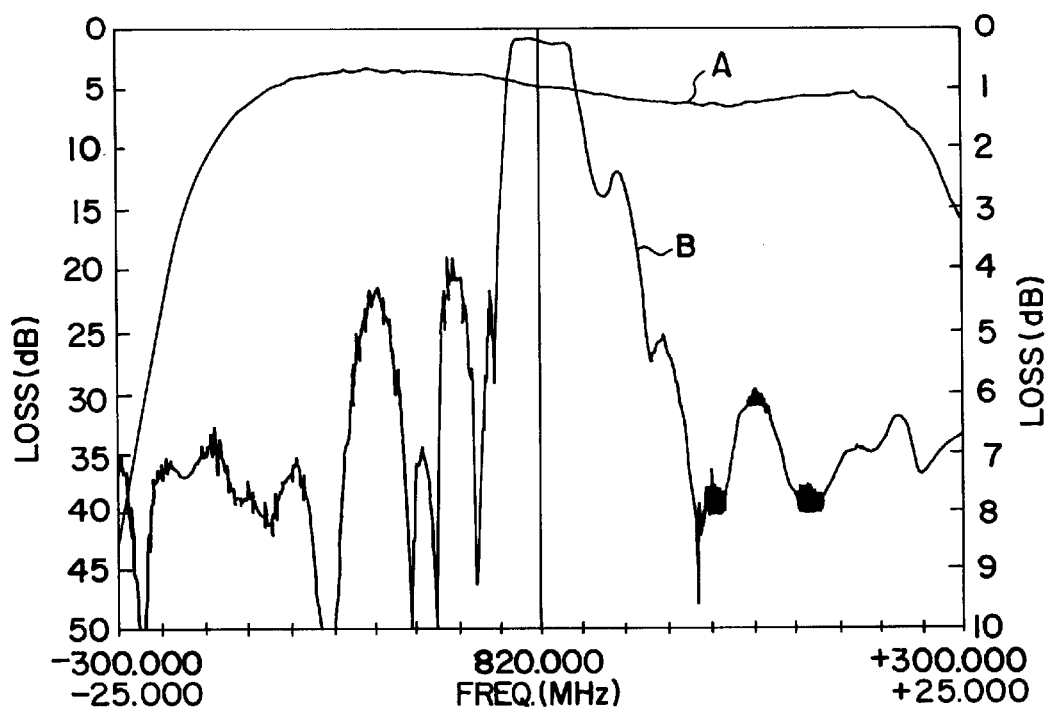
FIG. 3 is a graph showing one example of filtering characteristics of the primary-third order (1–3 order) longitudinally coupled double mode SAW filter where the electrode configuration of the present invention is used.
Figure 4:
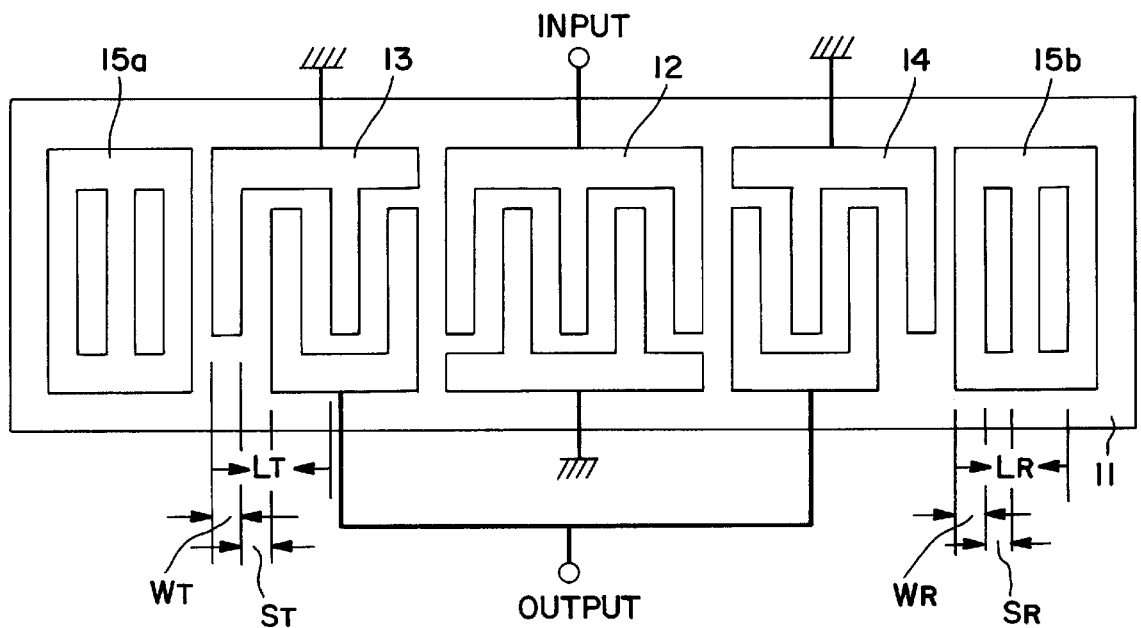
FIG. 4 is an illustrative plan view showing an electrode configuration of a conventional primary-third order (1–3 order) longitudinally coupled double mode SAW filter.
Figure 5:
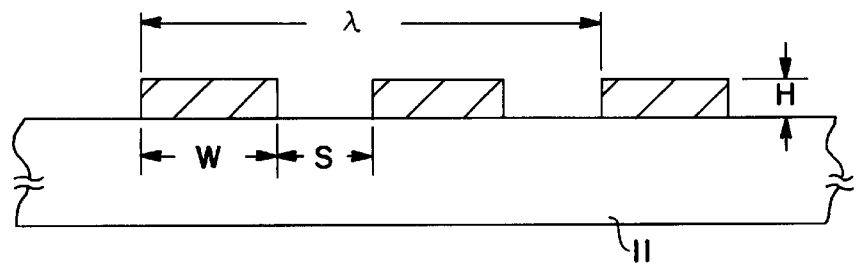
FIG. 5 is a view for explaining an electrode film thickness H/λ and a line occupation rate W/(W+S).
Figure 6:
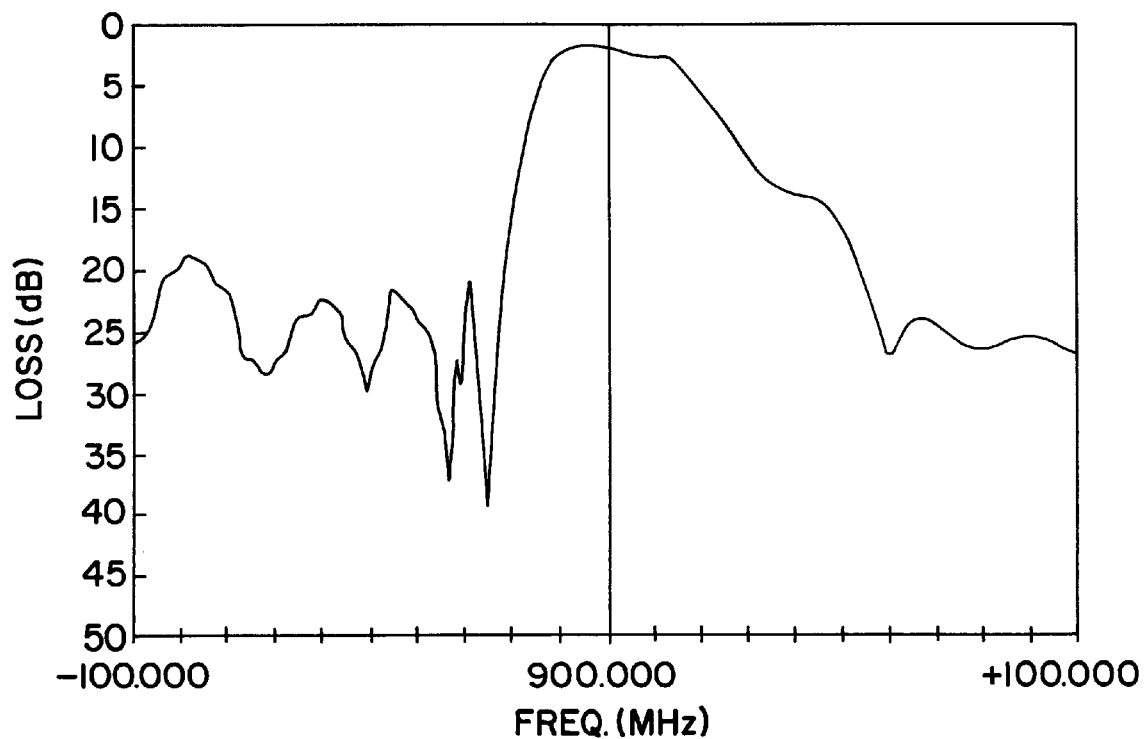
FIG. 6 is a graph showing filter characteristics of a primary-third order (1–3 order) longitudinally coupled double mode SAW filter obtained when only a frequency interval between the primary resonance mode and the third-order resonance mode is broadened and a stop band width of a reflector is maintained in an original state.

A filtering characteristic of a double mode SAW filter in a case where the line occupation rate $R_R$ is 35% is shown in FIG. 3. 'A' is a pass band and 'B' is an attenuation characteristic. A pass band width of 1 dB is 40.7 MHz and an insertion loss is 1 dB or less, which means that the pass band width is expanded by about 30% or more as compared with that of the conventional double mode SAW filter.

Herein, it has been confirmed that, when the line occupation rate $R_T$ Of the IDT electrodes 2, 3, 4 is set to 70% and the line occupation rate $R_R$ of the reflectors 5a, 5b is set to be 30% to 50%, the ratio $L_T/L_R$ of the IDT electrode period $L_T$ to the reflector period $L_R$ is required to be set to a small value of 0.960 to 0.971.

This is because it has been necessary that the ratio $L_T/L_R$ of the IDT electrode period $L_T$ to the reflector period $L_R$ is made smaller than the conventional one to cause the central frequency fc=(f1+f3)/2 (where f1 is a frequency of the primary order mode, f3 is a frequency of the third order mode) and the central frequency of the stop bands thereof to coincide with each other in order to accommodate the resonance frequencies of the primary and third-order modes within the stop bands, due to that the resonance frequencies of the primary and third-order modes excited by the electrode have been lowered as the line occupation rate $R_T$ of the IDT electrodes 2, 3, 4 has been made large and the central frequency of the stop band formed by the reflectors 5a, 5b has been raised as the line occupation rate $R_R$ of the reflectors 5a, 5b has been made small.

In a case where the flatness of the pass band of a double mode SAW filter is made important, the stop band width of the reflectors 5a, 5b is set considerably broader than the resonance interval between the primary mode and the third-order. As means for broadening the stop band width $\Delta f/f_0$, the stop band width $\Delta f/f_0$ may be set to become the maximum from the relationship between the line occupation rate $R_R$ (wherein $R_R=(W_R/(W_R+S_R))$ of the reflector 5a, 5b and the stop band width $\Delta f/f_0$.

Also, in a case that such a design is performed that an attenuation characteristic of a double mode SAW filter is made important, the stop band width of the reflectors 5a, 5b may be set to be slightly broader than the resonance frequencies of the primary mode and the third-order mode deciding a desired band width. Even in this case, a desired stop band width $\Delta f/f_0$ may be set from the relationship between the line occupation rate $R_R$ of the reflectors 5a, 5b and the stop band width $\Delta f/f_0$.

In this manner, the feature of the present invention lies in that contrary to the conventional design where the line occupant rate of the IDT and the occupation rate of the reflector are approximately equal to each other, the above line occupation rates are set according to the desired characteristics of a double mode SAW filter.

Accordingly, the present invention is characterized in that, for the purpose of realizing a broad-band filter, the occupation rate of the reflector is set to be smaller than the line occupation rate of the IDT, the stop band width of the reflector is selected appropriately according to required characteristics for the filter, and the line occupation rate of the reflector is set to be smaller than 50%, namely, the electrode finger width is set to be smaller than a gap between the electrode fingers.

Also, an important feature of the present invention lies in that the value of the ratio $L_T/L_R$ of the period $L_T$ Of the IDT electrodes 2, 3, 4 to the period $L_T$ of the reflectors 5a, 5b is set to be a value smaller than that of a conventional example, for example, 0.98 or less, such that the primary and third-order resonance frequencies excited by the IDT electrodes 2, 3, 4 are set properly so as to correspond to the stop band width formed by the reflectors 5a, 5b.

In the above, though the primary-third order (1–3 order) longitudinally coupled double mode SAW filter has been explained as an example, the present invention is, of course, applicable to any multi-mode filter such as a primary-secondary (1-2 order) longitudinally coupled double mode SAW filter, a primary-secondary-third-order (1-2-3 order) longitudinally coupled triple mode SAW filter, a primary-third-order-fifth order (1-3-5 order) longitudinally coupled triple mode SAW filter, and the like.

Furthermore, the present invention has been explained using LiTaO$_3$, but the present invention is also applicable to other piezoelectric materials such as LiNbO$_3$, LBO, La$_3$Ga$_5$SiO$_{14}$, and the like.

As explained above, in the present invention, since the number of the IDT electrode pairs and its line occupation rate have been set and the stop band width formed by the reflectors has been set according to desired filter characteristics, a longitudinally coupled multi-mode SAW filter where a pass band width is broad and it is flat has been configured when the present invention is applied to a new communication system having a broad band. When the present filter is used for a portable telephone of the new communication system, it is possible to remarkably improve the communication quality of the portable telephone.

What is claimed is:

1. In a longitudinally coupled multi-mode broad-band surface acoustic wave filter configured by disposing a plurality of IDT electrodes on a piezoelectric substrate in a propagating direction of a surface acoustic wave and disposing reflectors on both sides of the IDT electrodes, the broad-band surface acoustic wave filter characterized in that the electrode width $W_R$ of each reflector is made smaller than a gap between electrode fingers of each reflectors; and wherein a ratio $L_T/L_R$ of the IDT electrode period $L_T$ to a reflector period $L_R$ is in the range of 0.960 to 0.971.

2. In a longitudinally coupled multi-mode broad-band surface acoustic wave filter configured by disposing a plurality of IDT electrodes on a piezoelectric substrate in a propagating direction of a surface acoustic wave and disposing reflectors on both sides of the IDT electrodes, the broad-band surface acoustic wave filter characterized in that the line occupation rate of the reflectors is made smaller than the occupation rate of the IDT electrodes, a ratio $L_T/L_R$ of the IDT electrode period $L_T$ to a reflector period $L_R$ is in the range of 0.960 to 0.971 and a line occupation rate of the IDT electrodes $R_T$ is 70%.

3. In a longitudinally coupled multi-mode broad-band surface acoustic wave filter configured by disposing a plurality of IDT electrodes on a piezoelectric substrate in a propagating direction of a surface acoustic wave and disposing reflectors on both sides of the IDT electrodes, the broad-band surface acoustic wave filter characterized in that the electrode width $W_R$ of each reflector is made smaller than a gap between electrode fingers of each reflectors; and, wherein, when a period between the electrode fingers of the IDT electrode is $L_T$, and a period of the reflector is $L_R$, a ratio of the periods $L_T$ and $L_R$ is set such that a central frequency of a stop band of the reflectors and a central frequency of the longitudinally coupled multi-mode broad-band surface acoustic wave filter are approximately equal to each other.

4. In a longitudinally coupled multi-mode broad-band surface acoustic wave filter configured by disposing a plurality of IDT electrodes on a piezoelectric substrate in a propagating direction of a surface acoustic wave and disposing reflectors on both sides of the IDT electrodes, the broad-band surface acoustic wave filter characterized in that the line occupation rate of the reflectors is made smaller than the occupation rate of the IDT electrodes; and when a period between the electrode fingers of the IDT electrode is $L_T$, and a period of the reflector is $L_R$, a ratio of the periods $L_T$ and $L_R$ is set such that a central frequency of a stop band of the reflectors and a central frequency of the longitudinally coupled multi-mode broad-band surface acoustic wave filter are approximately equal to each other.

* * * * *